(12) United States Patent
Kawaguchi et al.

(10) Patent No.: US 10,034,364 B2
(45) Date of Patent: Jul. 24, 2018

(54) METHOD OF MANUFACTURING AN ALECTRONIC CIRCUIT

(71) Applicants: Kitagawa Industries Co., Ltd., Inazawa-shi, Aichi (JP); TYK Corporation, Minato-ku, Tokyo (JP)

(72) Inventors: Yasuhiro Kawaguchi, Inazawa (JP); Masataka Kubo, Gifu (JP)

(73) Assignees: Kitagawa Industries Co., Ltd., Inazawa-Shi, Aichi (JP); TYK Corporation, Minato-Ku, Tokyo (JP)

( * ) Notice: Subject to any disclaimer, the term of this patent is extended or adjusted under 35 U.S.C. 154(b) by 128 days.

(21) Appl. No.: 15/134,526

(22) Filed: Apr. 21, 2016

(65) Prior Publication Data

US 2016/0242272 A1    Aug. 18, 2016

Related U.S. Application Data

(63) Continuation of application No. 13/884,672, filed as application No. PCT/JP2011/076099 on Nov. 11, 2011.

(30) Foreign Application Priority Data

Nov. 11, 2010  (JP) ................................ 2010-253005
Nov. 10, 2011  (JP) ................................ 2011-246722

(51) Int. Cl.
*H01L 23/373* (2006.01)
*H05K 1/02* (2006.01)
(Continued)

(52) U.S. Cl.
CPC ......... *H05K 1/0203* (2013.01); *F28F 13/003* (2013.01); *F28F 21/04* (2013.01); *H01L 23/3733* (2013.01); *H01L 2924/0002* (2013.01)

(58) Field of Classification Search
CPC . C22C 1/10; C22C 1/1036; C22C 2001/1047; C22C 2001/1052;
(Continued)

(56) References Cited

U.S. PATENT DOCUMENTS 4,120,829 A   10/1978  Dulin
4,517,584 A    5/1985  Matsushita et al.
(Continued)

FOREIGN PATENT DOCUMENTS

CN       1341578 A     3/2002
CN     101098614 A     1/2008
(Continued)

OTHER PUBLICATIONS

International Search Report Corresponding to PCT/JP2011/076099 dated Feb. 14, 2012.
(Continued)

*Primary Examiner* — Carl Arbes
(74) *Attorney, Agent, or Firm* — Davis & Bujold PLLC; Michael J. Bujold

(57) ABSTRACT

An electronic circuit of the present invention includes: a circuit board on which an electronic component is mounted; a heat conducting sheet stacked on the electronic component; and a heat sink stacked on the heat conducting sheet. The heat sink includes a porous ceramics having a volume resistivity of $10^{10}$ Ohm·cm or more and a porosity of 15-50 vol %.

4 Claims, 1 Drawing Sheet

(51) Int. Cl.
*F28F 13/00* (2006.01)
*F28F 21/04* (2006.01)

(58) Field of Classification Search
CPC ......... C22C 21/00; C22C 21/04; C22C 21/06;
C22C 29/00; H01L 23/36; H01L 23/373;
H01L 23/3731; H01L 23/3733; H01L
2924/00; H01L 2924/0002; F28F 13/003;
F28F 21/04; H05K 1/0203
See application file for complete search history.

(56) References Cited

U.S. PATENT DOCUMENTS

| | | |
|---|---|---|
| 4,999,137 A | 3/1991 | Wapler et al. |
| 5,347,426 A | 9/1994 | Dermarkar et al. |
| 5,386,143 A | 1/1995 | Fitch |
| 5,750,449 A | 5/1998 | Niihara et al. |
| 5,948,521 A | 9/1999 | Dlugosch et al. |
| 6,110,577 A | 8/2000 | Ishikawa et al. |
| 6,156,686 A | 12/2000 | Katsuda et al. |
| 6,669,751 B1 | 12/2003 | Ohno et al. |
| 6,705,393 B1 | 3/2004 | Hsu |
| 6,777,114 B2 | 8/2004 | Tomito et al. |
| 2006/0209514 A1 | 9/2006 | Katoh |
| 2008/0013279 A1 | 1/2008 | Aoyama et al. |
| 2008/0014455 A1 | 1/2008 | Pyzik et al. |
| 2008/0203557 A1 | 8/2008 | Yamamoto et al. |
| 2009/0280351 A1 | 11/2009 | Hirotsuru et al. |
| 2010/0019380 A1 | 1/2010 | Lin et al. |
| 2012/0255719 A1 | 10/2012 | Hsueh |

FOREIGN PATENT DOCUMENTS

| | | | |
|---|---|---|---|
| JP | H06-61387 A | | 3/1994 |
| JP | H0661387 A | * | 3/1994 |
| JP | H11-171649 A | | 6/1999 |
| JP | 3100267 U | | 5/2004 |
| JP | 2006-261519 A | | 9/2006 |
| JP | 2007-173338 A | | 7/2007 |
| JP | 2008-010761 A | | 1/2008 |
| JP | 2008-311375 A | | 12/2008 |
| JP | 4233133 | * | 3/2009 |
| JP | 4233133 B2 | | 3/2009 |
| WO | 2011/025299 A2 | | 3/2011 |

OTHER PUBLICATIONS

International Preliminary Report on Patentability Corresponding to PCT/JP2011/076099 dated May 16, 2013.
Chinese Office Action Corresponding to 201180054310.6 dated Dec. 3, 2015.
Chinese Office Action issued in corresponding Chinese Patent Application No. 201180054310.6 dated May 17, 2016.

* cited by examiner

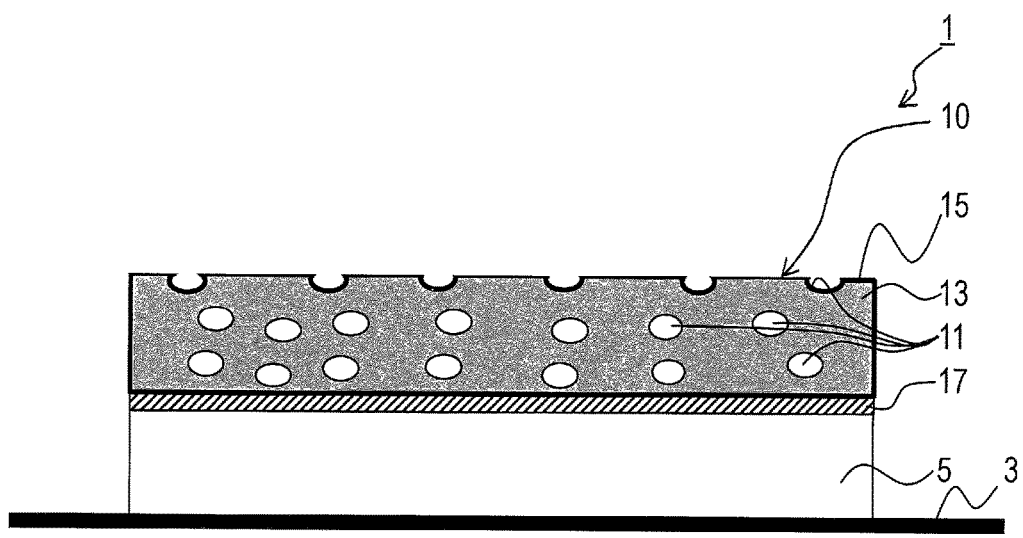

METHOD OF MANUFACTURING AN ALECTRONIC CIRCUIT

CROSS-REFERENCE TO RELATED APPLICATIONS

This international application claims the benefits of Japanese Patent Application No. 2010-253005 filed Nov. 11, 2010 and Japanese Patent Application No. 2011-246722 filed Nov. 10, 2011 in the Japan Patent Office, and the entire disclosures of Japanese Patent Applications Nos. 2010-253005 and 2011-246722 are incorporated herein by reference.

TECHNICAL FIELD

The present invention relates to an electronic circuit, which is provided with a circuit board on which an electronic component is mounted, a heat conducting sheet stacked on the electronic component, and a heat sink stacked on the heat conducting sheet. The present invention further relates to a heat sink available for the electronic circuit.

BACKGROUND ART

In an electronic circuit having an electronic component, such as IC, mounted on a circuit board, it has been an object to release efficiently heat which the electronic component generates. It has been thus proposed to stack a heat sink on a surface of the electronic component mounted on the circuit board via a heat conducting sheet having high thermal conductivity. Accordingly, it is possible to release the heat generated by the electronic component to the side of the heat sink via the heat conducting sheet, thereby enabling to release the heat from the heat sink.

As this type of heat sink, some metallic heat sink has been commonly used, which is given with microfabrication by die-casting or machine processing and then of which surface area is increased. Meanwhile, some heat sink has been proposed, which is produced by casting metallic molten metal into a porous ceramics obtained by sintering silicon carbide (e.g., see Patent Document 1).

PRIOR ART DOCUMENTS

Patent Documents

Patent Document 1: Japanese Patent No. 4233133

SUMMARY OF THE INVENTION

Problems to be Solved by the Invention

However, because any of the above heat sinks are conductors, when the heat sink is stacked on the surfaces of the electronic component with the heat conducting sheet interposed therebetween, it would be configured so that two conductors are arranged in parallel, with the interposing heat conducting sheet being an insulator. According to this configuration, high frequency noise was likely to be generated. Therefore, so as not to generate this high frequency noise, an approach, for example, has been considered to connect the heat sink to an earth electrode of the circuit board. In this case, limitation on designing of the electronic circuit occurs.

In light of the forgoing, the present invention has been made for the purpose of providing an electronic circuit having an improved freedom of designing by use of a heat sink made of an insulator and for the purpose of providing an insulating heat sink available for the electronic circuit.

Means for Solving the Problems

An electronic circuit of the present invention made in order to achieve the above object includes a circuit board on which an electronic component is mounted, a heat conducting sheet stacked on the electronic component, and a heat sink stacked on the heat conducting sheet, and in that the heat sink includes a porous ceramics having a volume resistivity of $10^{10}$ Ohm·cm or more and a porosity of 15-50 vol %.

In the electronic circuit of the present invention configured as described above, it is possible to let heat generated by the electronic component go to the side of the heat sink via the heat conducting sheet and to release the heat from the heat sink.

Further, the heat sink is made of the porous ceramics having a volume resistivity of $10^{10}$ Ohm·cm or more, which is a level of volume resistivity to be generally defined as an insulator. Therefore, it is possible to inhibit high frequency noise from occurring without an approach to connect the heat sink to an earth electrode as described above.

In addition, since the porous ceramics configuring the heat sink has the porosity of 15-50 vol %, it is lightweight, excels in heat releasing, and excels in workability when it is formed into a given shape. Therefore, in the electronic circuit of the present invention, freedom of designing is improved widely.

The heat sink of the present invention includes the porous ceramics having a volume resistivity of $10^{10}$ Ohm·cm or more and a porosity of 15-50 vol %. The heat sink of the present invention configured as described above includes the porous ceramics having a volume resistivity of $10^{10}$ Ohm·cm or more, which is a level of volume resistivity to be generally defined as an insulator.

Therefore, when the heat sink is stacked on the electronic component via the heat conducting sheet, it is possible to inhibit high frequency noise from occurring without an approach to connect the heat sink to an earth electrode as described above.

In addition, since the porous ceramics configuring the heat sink has the porosity of 15-50 vol %, it is lightweight, excels in heat releasing, and excels in workability when it is formed into a given shape.

As material for the porous ceramics having a volume resistivity of $10^{10}$ Ohm·cm or more, which is a level of volume resistivity to be generally defined as an insulator, alumina ($Al_2O_3$), silica (silica dioxide: $SiO_2$), zirconia ($ZrO_2$), etc. are listed.

The porosity of the porous ceramics of the present invention can be set to a target porosity by mixing a volatile element, which volatiles and disappears when baking, to the above mentioned alumina, silica, etc. It is set by mixing the volatile element, such as PVA for example, by the degree of a target porosity and by baking after molding into a given shape of the heat sink. Besides this, a method of making some conventional ceramics porous is available.

When the porosity of the porous ceramics is 15 vol % or more, insulation properties are good and volume resistivity can be secured.

Meanwhile, when it is 50 vol % or less, air having high thermal insulation properties becomes less inside the porous ceramics. Therefore, heat releasing is good.

The density of the porous ceramics may be 1.6-3 g/cm$^3$. In this case, the heat sink has remarkably good lightweight properties and can be applied preferably to an electronic circuit of an electronic device required to be smaller and lighter.

The porous ceramics may be made by sintering granulated particles obtained by mixing at least silica dioxide, alumina, and silicon carbide (SiC). Here, a particle diameter of each particle of the granulated particles may be 10 μm.

A large particle having a particle diameter of 10 μm or more is usually used as a polishing agent and is unfavorable as a material for ceramics because a sintered body obtained is not densified. However, an applicant of the present invention has found that it is possible to easily manufacture the above described porous ceramics by sintering the granulated particles, each particle having a particle diameter of 10 μm or more, obtained by mixing at least silica dioxide, alumina, and silicon carbide.

Accordingly, when the above described porous ceramics is made by sintering the granulated particles, each particle having a particle diameter of 10 μm or more, obtained by mixing at least silica dioxide, alumina, and silicon carbide, it is possible to reduce preferably manufacturing (material) costs of the heat sink.

Further, it is preferable to set an upper limit of the particle diameter of the granulated particle at 1250 μm. Granulated particles having any greater particle diameters than this one have difficulty in being manufactured and is likely to crumble after being molded in to a predetermined shape and to have difficulty in remaining in the same shape. Therefore, the particle diameter of the granulated particle is preferably in the range of 10-1250 μm.

Further, it is preferable that the average particle diameter of the silicon carbide is 10 μm or more and 150 μm or less.

When the average particle diameter is 150 μm or less, following advantages are given. That is: (1) It is possible to enhance insulation properties of the heat sink configured with the porous ceramics obtained therefrom. That is, the volume resistivity is further increased, so that a value of $10^{10}$ Ohm-centimeter (Ohm·cm) or more can be achieved easily. This is because, when the average particle diameter of the silicon carbide exceeds 150 μm, respective particles of the silicon carbide are drawn near one another in the matrix of the porous ceramics. Separate intervals therebetween are hence shortened, so that electric conduction becomes easier via the silicon carbide. (2) The granulated particles can be granulated easily, in other words in a short amount of time. This is because, when the silicon carbide being one of the particles configuring the granulated particles is fine, the silicon carbide can disperse uniformly inside the granulated particles. As described above, from the granulated particles configured with materials each dispersed uniformly, a porous ceramics, i.e., heat sink, having a stabilized physical property can be obtained.

Meanwhile, when the average particle diameter of the silicon carbide is 10 μm or more, a procurement of the material is allowed at a low price (because the particle of the silicon carbide is large, for example, such as that kind of silicon carbide used as a polishing agent), thereby enabling to reduce the manufacturing (material) costs easily.

Still further, also regarding the silica dioxide and the alumina, it is preferable that the average particle diameter of each is 1 μm or more. When the particle diameter is 1 μm or more, a procurement of the material is allowed at a low cost, thereby enabling to reduce the manufacturing (material) cost easily.

Meanwhile, the upper limits of the average particle diameters of the silica dioxide and the alumina are not limited specifically as far as the particle diameter of the granulated particle obtained therefrom becomes 10-1250 μm. However, in general, it is preferable that the average particle diameter is less than 10 μm. It is because the granulated particles can be granulated easily, i.e., in a short amount of time.

The granulated particles are manufactured by mixing the above materials for ceramics and binder by use of a mixer, kneader for example.

Regarding the heat sink of the present invention, the porous ceramics may be made by sintering granulated particles obtained by mixing 60-85 weight % of silicon carbide and at least 10 weight % or more of silica dioxide. In this case, it is possible to manufacture further stably and easily the porous ceramics having the above described volume resistivity and porosity.

Further, it is needless to say that material, such as water, iron oxide, used to sinter a generally used ceramics may be added supplementarily in addition to the above composition.

Specifically, when the silicon carbide is 60 weight % or more, further sufficient heat releasing characteristics can be obtained. This attributes to that, since the silicon carbide having a good thermal conductivity is rich in the matrix, it is possible to sufficiently ensure a heat conduction path and that, since the amounts of silica dioxide and alumina are reduced relatively, the porosity is increased and convective effect of the heat is lowered.

Meanwhile, when the silicon carbide is 85 weight % or less, relative permittivity is lowered, thereby enabling to ensure higher insulation properties.

When the silica dioxide is 10 weight % or more, the strength of the heat sink is increased. Therefore, even if the heat sink is shaped so that it becomes brittle having multiple protrusions for example, it is possible to ensure a sufficient strength as a heat sink.

Meanwhile, when the silica dioxide is 40 weight % or less, heat releasing characteristics is further improved. This is because, when the amount of silica dioxide is 40 weight % or less, the silica dioxide is bound with silicon carbide more strongly when baking the porous ceramics, the diameter of each pore hence becomes less, and heat transferring by air convention in each pore becomes worse. This means that a porous ceramics having a less amount of silica dioxide shows higher heat releasing characteristics even if the porosities are the same.

Further, granulated particles may be obtained by mixing at least 1 weight % or more of alumina with the above-described silicon carbide and silica dioxide.

When this alumina is 1 weight % or more, the strength of the heat sink is further increased. Therefore, even when the heat sink is shaped such that it becomes brittle having multiple protrusions for example, it is possible to ensure a sufficient strength as a heat sink. That is, the heat sink of the present invention may be shaped to have such protrusions, and "stacking" of the present invention may be an arrangement of at least overlapping.

Meanwhile, when the alumina exceeds 10 weight %, it should be noted that there is a possibility that a problem of lowering of heat releasing characteristics becomes obvious, which is due to the diminishing of the pore diameter as described above.

Besides the above, it is preferable that the above described sintering is performed at the oxygen ambient (for example, in the air). In this case, regarding the silicon carbide exposed to the surface, as a result of oxidation, its carbon element is desorbed as carbon dioxide and its silicon element is formed to silica dioxide.

Here, (1) it has been known that silica dioxide has thermal emittance higher than the one of silicon carbide. Further, (2)

at the surface of the silicon carbide, a surface area per unit weight is increased by roughness caused by decarburization.

The above descried effects (1) and (2) further enhances the heat releasing characteristics of the heat sink. Therefore, when it is applied to the electronic circuit as described above, it is possible to further favorably inhibit an electronic component from overheating.

According to the heat sink of the present invention, a heat-releasing paint having a thermal emittance of 0.9 or more may be applied on its surface. In this case, it is possible to further improve heat releasing characteristics of the heat sink and furthermore possible to further favorably inhibit an electronic component from overheating when it is applied to the electronic circuit as described above. The above 0.9 is a value arbitrarily set as a value higher than a thermal emittance of silicon carbide in consideration of that the thermal emittance of silicon carbide is 0.7.

In addition, in this case, the heat-releasing paint may be applied to the entire circumferential surface of the heat sink and a heat conducting tape may be adhesively attached to one surface of the heat sink. In this case, the heat sink can be directly attached to the electronic component via the heat conducting tape. Accordingly, it can be configured easily such that the heat sink is stacked on the electronic component with the heat conducting tape, as an example of the heat conducting sheet, interposed therebetween.

According to the heat sink of the present invention, the porous ceramics may possess some liquid substance having thermal conductivity in the pores. This type of heat sink is sometimes stacked on the electronic component via some liquid substance, such as thermal conductive grease, thermal conductive adhesive, having thermal conductivity. Since the heat sink of the present invention is configured with the porous ceramics as described above, it is possible to retain the liquid substance in the pores. Accordingly, in this case, it is possible to inhibit the liquid substance from dripping.

The heat sink of the present invention may be 0.1-5.0 mm in thickness. In this case, the heat sink becomes light and easy to use, and can be applied further favorably to an electronic circuit for an electronic device required to be smaller and lighter.

BRIEF DESCRIPTION OF THE DRAWINGS

FIG. 1 is a schematic cross sectional view illustrating a configuration of an electronic circuit to which the present invention is applied.

EXPLANATION OF REFERENCE NUMERALS

1 . . . electronic circuit, 3 . . . printed circuit board, 5 . . . electronic component, 10 . . . heat sink, 11 . . . pores, 13 . . . porous ceramics, 15 . . . heat-releasing paint, 17 . . . heat conducting tape

MODE FOR CARRYING OUT THE INVENTION

Next, an embodiment of the present invention will be described with reference to the drawing. FIG. 1 is a schematic cross sectional view illustrating a configuration of an electronic circuit 1 which the present invention is applied to. As illustrated in FIG. 1, the electronic circuit 1 of the embodiment has a known configuration in which an electronic component 5, such as IC tip, is mounted on a surface of a printed circuit board 3 serving as an example of a circuit board. A heat sink 10 as described below is stacked on a surface of the electronic component 5.

The heat sink 10 includes a porous ceramics 13 being 0.1-5.0 mm in thickness and having multiple pores 11. At a surface of the porous ceramics 13, a heat-releasing paint 15 having thermal emittance of 0.9 or more is applied on an entire circumferential surface as indicated by a black line in FIG. 1. Further, a heat conducting tape 17 (one example of heat conducting sheet) is adhesively attached to one surface of the porous ceramics 13 (surface at the side stacked on the electronic component 5) while covering the heat-releasing paint 15.

Here, the porous ceramics 13 can be produced as described below for example. That is, it is able to be produced by weighing PVA, water, and ceramic raw materials described below, kneading by a kneader and granulating, forming by a mold, and sintering at a low temperature being 1200° C. or more and below 1400° C. (preferably 1300° C. or more and below 1400° C.) in the air.

The composition of the ceramic raw materials can be formed, for example, by adding 1 part by weight of iron oxide into an entire raw material which is 100 parts by weight with 60-85 weight % of silicon carbide having an average particle diameter of 150 μm, 10-30 weight % of silica dioxide, and 1-10 weight % of alumina. By such method of producing, it is possible to obtain preferably the porous ceramics 13 having a volume resistivity of $10^{10}$ Ohm·cm or more, a density of 1.6-3 g/cm$^3$, and a porosity of 15-50 vol %.

Further, as the heat-releasing paint 15, a commercial item, such as "CT-100" (product name: manufactured by Okitsumo), can be used. Applying the heat-releasing paint 15 about 100 μm thickness (±10%) is preferable in order to ensure heat releasing characteristics of the heat sink 10 and to prevent ceramic powder from falling off. Still further, as the heat conducting tape 17, it is possible to use a tape made by filling alumina in an acryl adhesive material.

In the porous ceramics 13 produced as described above, at a time of sintering, the silicon carbide on the surface is converted to silica dioxide and the surface of the heat sink becomes roughened. The silica dioxide has thermal emittance higher than the one of the silicon carbide, and the roughness increases a surface area of the porous ceramics 13. Therefore, it is possible to further improve the heat releasing characteristics of the heat sink 10. In addition, as illustrated in FIG. 1, since the pores 11 are exposed also on an upper surface of the porous ceramics 13 (opposite side to the electronic component 5), and the heat-releasing paint 15 is applied on the entire circumferential surface, the heat releasing characteristics of the heat sink 10 is further improved.

Therefore, in the electronic circuit 1 in which the heat sink 10 described above is stacked on the electronic component 5 with the heat conducting tape 17 interposed therebetween, it is possible to let heat generated by the electronic component 5 go to the side of the heat sink 10 via the heat conducing tape 17 and to release successfully the heat from the heat sink 10. In addition, the heat sink 10 is configured with the porous ceramics 13 having a volume resistivity of $10^{10}$ Ohm·cm or more which is a level of volume resistivity to be defined as an insulator in general. Therefore, it is possible to eliminate the occurrence of high frequency noise without an approach to be connected to an earth electrode.

Further, the porous ceramics 13 configuring the heat sink 10 has a porosity of 15-50 vol %. Therefore, it is lightweight with a density of 1.6-3.0 g/cm$^3$ and excels in workability when being processed into a given shape. Therefore, in the electronic circuit 1, freedom of designing is widely improved. Further, the heat sink 10 is 0.1-5.0 mm in thickness and is lightweight as described above, so that it is successfully applicable to an electronic circuit of an electronic device required to be smaller and lighter.

Still further, the porous ceramics 13 does not use fine silicon carbide, which is less than 10 μm and is costly, used to obtain a dense sintered body. Further, the producing method is easy as described above. Therefore, it is possible to reduce the manufacturing cost. Further, the porous ceramics 13 manufactured as described above has a low thermal expansion coefficient, which is a linear expansion coefficient of about 3-5 ppm that is close to the one of a ceramic substrate. Therefore, it does not provide stress in vain to the electronic component 5.

The present invention should not be construed as limited to the embodiment set forth above and can be achieved in any modes within the scope of the present invention. For example, the heat-releasing paint 15 does not have to be applied at all, may be applied only to the upper surface of the porous ceramics 13, or may be applied to the entire surface excluding a bottom surface of the porous ceramics 13. This type of heat sink 10 sometimes may be stacked on the electronic component 5 via a liquid substance having thermal conductivity, such as thermal conductive grease or thermal conductive adhesive. In this case, since the heat sink 10 is configured with the porous ceramics 13 as described above, it is possible to maintain the liquid substance in the pores. Accordingly, in this case, it is possible to inhibit the liquid substance dripping. In addition, when inhibitory effect of such dripping is expected, it may be sometimes preferable not to apply the heat-releasing paint 15 or apply excluding the bottom surface.

Further, it is possible to omit the heat conducting tape 17. In this case, the heat sink 10 is stacked on the electronic component 5 interposing a commercial heat conducting sheet such as "COOL PROVEIDE (product name: manufactured by Kitagawa Industries Co., Ltd.)" for example. However, as described above, when the heat conducting tape 17 is provided, by directly sticking the heat sink 10 onto the electronic component 5 via the heat conducting tap 17, it can be configured easily such that the heat sink 10 is stacked on the electronic component 5 with the heat conducting tape 17, as one example of a heat conducting sheet, interposed therebetween.

EXPERIMENTAL EXAMPLE

Experimental examples concerning the heat sink of the present invention will be explained below in detail.

1. The granulated particles are manufactured by mixing the ceramic raw materials blended in accordance with the blend ratio (weight %) indicated at the right column of Table 1 with the other component (1 parts by weight or less of iron oxide out of 100 parts by weight of ceramic raw materials) at a required amount and binder, whereby each of the granulated particles is sized to a required particle diameter. The mixed quantity of the binder is determined in a manner that a specimen (heat sink) obtains a certain level of porosity.

2. A plate-like body is molded from the granulated particles, which is then formed to be a plate-like specimen (heat sink) of 20×20×3 mm after baking.

3. The specimen is obtained by baking the plate-like body under the condition of 1350° C. at an ambient environment.

4. The handling (moldability) of the plate-like body and the porosity, volume resistivity, and heat-releasing characteristics, of the specimen obtained were measured and evaluated by the method described below.

Handling (moldability): If, at the time of molding the plate-like body at the step of the above 2, the plate-like body was moldable, was able to be thrown to a baking furnace, and the baking was completed while maintaining the shape of the plate-like body, it was evaluated "○". If the plate-like body was not able to be molded (e.g., crumbling), or if the plate-like body was molded but was not able to be thrown to the baking furnace and the baking was not completed, it was evaluated "×".

Porosity: it was measured by use of a testing machine (product name: AutoPore IV 9500, manufactured by Micromeritics).

Volume resistivity: it was measured by a testing machine (product name: Hiresta, manufactured by Mitsubishi Chemical). When the value was less than $1×10^{10}$ Ohm-centimeter (Ohm·cm), it was evaluated "×". When the value was within $1×10^{10}$ Ohm-centimeter (Ohm·cm) to $2×10^{10}$ Ohm-centimeter (Ohm·cm), it was evaluated "Δ". When the value was $2×10^{10}$ Ohm-centimeter (Ohm·cm) or more, it was evaluated "○".

Heat-releasing characteristics: a heat source was set to have a surface temperature at 90° C., the specimen was mounted on its surface, and the surface temperature of the heat source stabilized in thirty minutes after being left was measured by use of a K-type thermocouple. With reference to 20.9° C. drop (69.1° C.) being a value of an aluminum plate (20×20×3 mm) of which heat-releasing characteristics was measured under the same condition, when the reduction in temperature was less than 20° C., it was evaluated "×". When the reduction in temperature was within 20-20.9° C., it was evaluated "Δ". When the reduction in temperature was 20.9° C. or more, it was evaluated "○".

The overall evaluation was made considering all of the above evaluations together. Specifically, when all the evaluations were "○", it was overall evaluated "◉". When there was at least one "Δ", it was overall evaluated "○". When there was at least one "×", it was overall evaluated "×".

Materials employed were as follows respectively.

SiC: product name: GP1000, manufactured by Shinano Electric Refining Co., Ltd. (average particle diameter 12 μm)

SiC: product name: GP400, manufactured by Shinano Electric Refining Co., Ltd. (average particle diameter 35 μm)

SiC: product name: GC100, manufactured by Shinano Electric Refining Co., Ltd. (average particle diameter 150 μm)

SiC: product name: GC80, manufactured by Shinano Electric Refining Co., Ltd. (average particle diameter 180 μm)

$SiO_2$: product name: silicon oxide (IV), powder, 1.0 micron, 99.9%, manufactured by Wako Pure Chemical Industries, Ltd. (average particle diameter 1 μm)

$Al_2O_3$: product name: AL-43-L, manufactured by Showa Denko K.K. (average particle diameter 1 μm)

iron oxide ($Fe_2O_3$): product name: iron oxide (III), manufactured by Wako Pure Chemical Industries, Ltd. (average particle diameter 1 μm)

binder: PVA (product name: JP-05, manufactured by Japan Vam & Poval Co., Ltd.)

TABLE 1

| Experimental Example | SiC (μm) 12 | 35 | 150 | 180 | Al₂O₃ | SiO₂ | Granulated Particle (μm) | Porosity (vol %) | Moldability | Volume Resistivity | Heat Releasing Characteristics | Overall Evaluation |
|---|---|---|---|---|---|---|---|---|---|---|---|---|
| Example 1 | 30 | 30 | | | 10 | 30 | 100~500 | 15 | ○ | Δ | ○ | ○ |
| Example 2 | ↑ | ↑ | | | ↑ | ↑ | ↑ | 35 | ○ | ○ ($2 \times 10^{10}$ Ω·cm) | ○ | ◉ |
| Example 3 | ↑ | ↑ | | | ↑ | ↑ | ↑ | 45 | ○ | ○ ($21.5 \times 10^{10}$ Ω·cm) | ○ (23.4° C.) | ◉ |
| Example 4 | ↑ | ↑ | | | ↑ | ↑ | ↑ | 50 | ○ | ○ ($50 \times 10^{10}$ Ω·cm) | Δ | ○ |
| Example 5 | 30 | 35 | | | 5 | 30 | ↑ | 15 | ○ | Δ | ○ | ○ |
| Example 6 | ↑ | ↑ | | | ↑ | ↑ | ↑ | 50 | ○ | ○ | Δ | ○ |
| Comparative Example 1 | 35 | 40 | | | 5 | 20 | ↑ | 10 | ○ | X | ○ | X |
| Example 7 | ↑ | ↑ | | | ↑ | ↑ | ↑ | 15 | ○ | Δ | ○ | ○ |
| Example 8 | ↑ | ↑ | | | ↑ | ↑ | ↑ | 35 | ○ | ○ | ○ | ◉ |
| Example 9 | ↑ | ↑ | | | ↑ | ↑ | ↑ | 50 | ○ | ○ | Δ | ○ |
| Comparative Example 2 | ↑ | ↑ | | | ↑ | ↑ | ↑ | 55 | ○ | ○ | X | X |
| Comparative Example 3 | ↑ | ↑ | | | ↑ | ↑ | 1300~1500 | 35 | X | not moldable, so not measured | | X |
| Example 10 | ↑ | ↑ | | | ↑ | ↑ | 500~1250 | ↑ | ○ | ○ | ○ | ◉ |
| Example 11 | ↑ | ↑ | | | ↑ | 25 | 100~500 | 35 | ○ | ○ | ○ | ◉ |
| Example 12 | 75 | | | | 5 | 20 | ↑ | 35 | ○ | ○ | ○ | ◉ |
| Example 13 | | 75 | | | ↑ | ↑ | ↑ | ↑ | ○ | ○ | ○ | ◉ |
| Example 14 | | | 75 | | ↑ | ↑ | ↑ | 15 | ○ | ○ | ○ | ◉ |
| Example 15 | | | ↑ | | ↑ | ↑ | ↑ | 35 | ○ | Δ | ○ | ○ |
| Example 16 | | | | 75 | ↑ | ↑ | ↑ | 15 | ○ | Δ | ○ | ○ |
| Comparative Example 4 | | | | ↑ | ↑ | ↑ | ↑ | 35 | ○ | X | ○ | X |
| Example 17 | 25 | 25 | 25 | | ↑ | ↑ | ↑ | ↑ | ○ | ○ | ○ | ○ |
| Example 18 | 40 | 45 | | | 5 | 10 | ↑ | 15 | ○ | Δ | ○ | ○ |
| Example 19 | ↑ | ↑ | | | ↑ | ↑ | ↑ | 35 | ○ | ○ | ○ | ◉ |
| Example 20 | ↑ | ↑ | | | 1 | ↑ | ↑ | 50 | ○ | ○ | Δ | ○ |
| Example 21 | 45 | 40 | | | 1 | ↑ | ↑ | 15 | ○ | Δ | ○ | ○ |
| Example 22 | ↑ | ↑ | | | ↑ | ↑ | ↑ | 35 | ○ | ○ | ○ | ◉ |
| Example 23 | ↑ | ↑ | | | 1 | ↑ | ↑ | 50 | ○ | ○ | Δ | ○ |
| Comparative Example 5 | 25 | 30 | | | 15 | 30 | ↑ | 35 | ○ | ○ | X | X |
| Comparative Example 6 | 40 | 50 | | | 1 | 9 | ↑ | ↑ | ○ | X | ○ | X |

Regarding the porosity of the specimen obtained, as indicated in Table 1, within the range of 15-50 vol %, it was confirmed that the volume resistivity was $1 \times 10^{10}$ Ohm-centimeter (Ohm·cm) or more and that heat-releasing characteristics was able to be ensured to be equal to or greater than the one of aluminum (overall evaluation "◉, ○").

When the porosity was less than 15 vol %, it was not possible to ensure the volume resistivity of $1 \times 10^{10}$ Ohm-centimeter (Ohm·cm) (comparative example 1). When this porosity exceeded 50 vol %, it was not possible to ensure heat-releasing characteristics (comparative example 2).

When the blend ratio of the silicon carbide was in the range of 60-85 weight %, it was confirmed that the high heat-releasing characteristics and the volume resistivity of $1 \times 10^{10}$ Ohm·cm or more was ensured regardless the average particle diameter of the silicon carbide.

When the blend ratio of the silicon carbide was less than 60 weight %, it was not possible to ensure heat-releasing characteristics (comparative example 5). When the blend ratio exceeded 85 weight %, it was not possible to ensure the volume resistivity of $1 \times 10^{10}$ Ohm-centimeter (Ohm·cm) (comparative example 6).

Further, regarding Example 2, Example 3, and Example 4, the volume resistivities were $2 \times 10^{10}$ Ohm-centimeter (Ohm·cm), $21.5 \times 10^{10}$ Ohm-centimeter (Ohm·cm), and $50 \times 10^{10}$ Ohm-centimeter (Ohm·cm), respectively. The reduction in temperature, which denotes the heat-releasing characteristics of Example 3, was 23.4° C.

Regarding the granulated particles, when its particle diameter was 1250 μm or less, it was confirmed to be able to ensure moldability and to be able to manufacture optimally a heat sink of the present invention. Meanwhile, when its particle exceeds 1250 μm (comparative example 3), it was not possible to ensure moldability.

The invention claimed is:

1. A method of manufacturing an electronic circuit comprising:
   a circuit board on which an electronic component is mounted;
   a heat conducting sheet stacked on the electronic component; and
   a heat sink stacked on the heat conducting sheet,
   wherein the heat sink comprises a porous ceramics having a volume resistivity of $10^{10}$ Ohm·cm or more and a porosity of 15-50 vol%, the method comprising:
   mixing at least silica dioxide, alumina and silicon carbide to produce granulated particles having a particle diameter of 10-1250 μm; and
   sintering the produced granulated particles at a temperature of 1,000-1,400° C., the silica dioxide and the alumina each having an average particle diameter of 1-10 μm and the silicon carbide having an average particle diameter of 10-150 μm.

2. The method of manufacturing the electronic circuit according to claim 1, wherein the porous ceramics includes 60-85 weight % of the silicon carbide and at least 10 weight % or more of the silica dioxide.

3. A method of manufacturing a heat sink comprising:
a porous ceramics having a volume resistivity of $10^{10}$ Ohm·cm or more and a porosity of 15-50 vol%, the method comprising:
mixing at least silica dioxide, alumina and silicon carbide to produce granulated particles having a particle diameter of 10-1250 μm; and
sintering the produced granulated particles at a temperature of 1,000-1,400° C., the silica dioxide and the alumina each having an average particle diameter of 1-10 μm and the silicon carbide having an average particle diameter of 10-150 μm.

4. The method of manufacturing the heat sink according to claim 3, wherein the porous ceramics includes 60-85 weight % of the silicon carbide and at least 10 weight % or more of the silica dioxide.

\* \* \* \* \*

UNITED STATES PATENT AND TRADEMARK OFFICE
CERTIFICATE OF CORRECTION

PATENT NO. : 10,034,364 B2
APPLICATION NO. : 15/134526
DATED : July 24, 2018
INVENTOR(S) : Yasuhiro Kawaguchi and Masataka Kubo Page 1 of 1

It is certified that error appears in the above-identified patent and that said Letters Patent is hereby corrected as shown below:

On the Title Page

Item (54) should read:
METHOD OF MANUFACTURING AN ELECTRONIC CIRCUIT

Signed and Sealed this
Twenty-eighth Day of May, 2019

Andrei Iancu
*Director of the United States Patent and Trademark Office*